United States Patent
Holmes et al.

(10) Patent No.: US 8,847,066 B2
(45) Date of Patent: Sep. 30, 2014

(54) GRADED ORGANIC PHOTOVOLTAIC DEVICE

(75) Inventors: Russell J. Holmes, Minneapolis, MN (US); Richa Pandey, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 806 days.

(21) Appl. No.: 12/783,308

(22) Filed: May 19, 2010

(65) Prior Publication Data
US 2010/0294351 A1  Nov. 25, 2010

Related U.S. Application Data

(60) Provisional application No. 61/216,643, filed on May 19, 2009.

(51) Int. Cl.
*H01L 51/44* (2006.01)
*H01L 51/48* (2006.01)
*H01L 51/42* (2006.01)
H01L 51/30 (2006.01)
H01L 51/46 (2006.01)
H01L 31/00 (2006.01)

(52) U.S. Cl.
CPC .......... *H01L 51/4253* (2013.01); *Y02E 10/549* (2013.01)
USPC .............. 136/255; 136/263; 136/256; 438/82

(58) Field of Classification Search
CPC ... H01L 51/4253; H01L 51/424; H01L 51/42; H01L 51/0032–51/0037; H01L 51/0046–51/0047; H01L 51/0077–51/0078; Y01E 10/549
USPC .......................... 136/263, 252, 244, 243, 255
IPC .......... H01L 27/28,27/30, 27/32, 51/00, 51/10, H01L 51/42, 51/44, 51/50, 51/52
See application file for complete search history.

(56) References Cited

U.S. PATENT DOCUMENTS 4,099,109 A  7/1978  Abbondanti
4,199,383 A  4/1980  Wittry
(Continued)

FOREIGN PATENT DOCUMENTS

WO   WO 2008/029161      3/2008
WO   WO 2008/063519      5/2008
WO   WO 2009056626 A1 *  5/2009

OTHER PUBLICATIONS

Drees, M.; Davis, R. M.; Heflin, J. R. "Improved morphology of polymer-fullerene photovoltaic devices with thermally induced concentration gradients." Journal of Applied Physics 2005, 97, 036103.*

(Continued)

*Primary Examiner* — Jeffrey T Barton
*Assistant Examiner* — Meisha Binkley
(74) *Attorney, Agent, or Firm* — Fish & Richardson P.C.

(57) ABSTRACT

A photovoltaic device includes a first heterojunction layer having a first donor type organic material and a first acceptor type organic material, in which a concentration of at least one of the first donor type organic material and the first acceptor type organic material is graded continuously from a first side of the first heterojunction layer to a second side of the first heterojunction layer.

22 Claims, 14 Drawing Sheets

(56) References Cited

U.S. PATENT DOCUMENTS

| | | | |
|---|---|---|---|
| 6,352,777 B1* | 3/2002 | Bulovic et al. | 428/411.1 |
| 2003/0042846 A1* | 3/2003 | Forrest et al. | 313/503 |
| 2006/0027802 A1* | 2/2006 | Forrest et al. | 257/40 |
| 2010/0084011 A1* | 4/2010 | Forrest et al. | 136/255 |

OTHER PUBLICATIONS

Chen, L.; Tang, Y.; Fan, X.; Zhang, C.; Chu, Z.; Wang, D.; Zou, D. "Improvement of the efficiency of CuPc/C60-based photovoltaic cells using a multistepped structure." Organic Electronics, 2009, 10, 724-728.*

Sullivan et al. "Influence of codeposition on the performance of CuPC-C60 heterojunction photovoltaic devices." Applied Physics Letters 2004, vol. 84, p. 1210-1212.* http://www.thefreedictionary.com/p/continuously accessed Jan. 27, 2014 (attached as thefreedictionary).*

Sahu et al. (Sahu, S. and Pal, A. Organic photodetectors based on graded heterostructure of donor and acceptor layers. Materials Science and Engineering 2007, vol. C 27, p. 746-749).*

Lindla, F., et al., "Highly efficient yellow organic light emitting diode based on a layer-cross faded emission layer allowing easy color tuning," Applied Physics Letters 95, 213305 1-213305-3 (2009).

Tang, C.W., "Two-Layer Organic Photovoltaic Cell," Applied Physics Letters 48:183-185 (1986).

Peumans, P., et al., "Very-High-Efficency Double-Heterostructure Copper Phthalocyanine/C60 Photovoltaic Cells," Applied Physics Letters 79:126-128 (2001).

Heutz, S., et al., "Influence of Molecular Architecture and Intermixing on the Photovoltaic, Morphological and Spectroscopic Properties of CuPc-C60 Heterojunctions," Solar Energy Materials & Solar Cells 83:229-245 (2004).

Sullivan, P., et al., "Influence of Codeposition on the Performance of CuPc-C60 Heterojunction Photovoltaic Devices," Applied Physics Letters 84:1210-1212 (2004).

Uchida, S., et al., "Organic Small Molecule Solar Cells with a Homogeneously Mixed Copper Phthalocyanine: C60 Active Layer," Applied Physics Letters 84:4218-4220 (2004).

Xue, J., et al., "A Hybrid Planar-Mixed Molecular Heterojunction Photovoltaic Cell," Advanced Materials 17:66-71 (2005).

Yang, F., et al., "Efficient Solar Cells Using All-Organic Nanocrystalline Networks," Advanced Materials 19:4166-4171 (2007).

Yu, G., et al., "Polymer Photovoltaic Cells: Enhanced Efficiencies via a Network of Internal Donor-Acceptor Heterojunctions," Science 270:1789-1791 (1995).

Li, G., et al., "High-Efficiency Solution Processable Polymer Photovoltaic Cells by Self-Organization of Polymer Blends," Nature Materials 4:864-868 (2005).

Ma, W., "Thermally Stable, Efficient Polymer Solar Cells with Nanoscale Control of the Interpenetrating Network Morphology," Advanced Functional Materials 15:1617-1622 (2005).

Peumans, P., et al., "Efficient Bulk Heterojunction Photovoltaic Cells Using Small-Molecular-Weight Organic Thin Films," Nature 425:158-162 (2003).

Yang, F., et al., "Controlled Growth of a Molecular Bulk Heterojunction Photovoltaic Cell," Nature Materials 4:37-41 (2005).

Rand, B. P., et al., "Mixed Donor-Acceptor Molecular Heterojunctions for Photovoltaic Applications. I. Material Properties," Journal of Applied Physics 98:124902-1-124902-7 (2005).

Pradhan, B., et al., "Organic Photovoltaic Devices: Concentration Gradient of Donor and Acceptor Materials in the Molecular Scale," Synthetic Metals 155:555-559 (2005).

Hiramoto, M., et al., "Three-Layered Organic Solar Cell with a Photoactive Interlayer of Codeposited Pigments," Applied Physics Letters 58:1062-1064 (1991).

Peumans, P., et al., "Small Molecular Weight Organic Thin-Film Photodetectors and Solar Cells," Journal of Applied Physics 93:3693-3723 (2003).

Drechsel, J., et al., "MIP-Type Organic Solar Cells Incorporating Phthalocyanine/Fullerene Mixed Layers and Doped Wide-Gap Transport Layers," Organic Electronics 5:175-186 (2004).

* cited by examiner

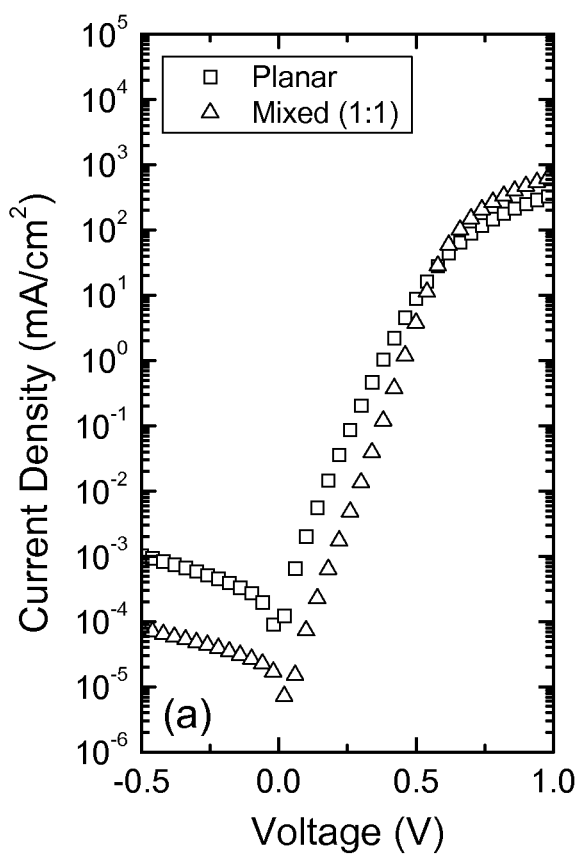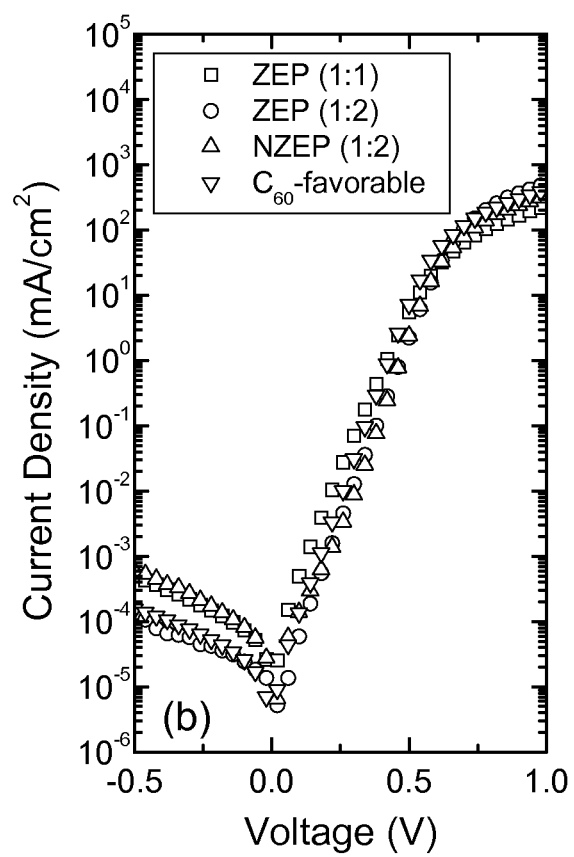
FIG. 9A
FIG. 9B

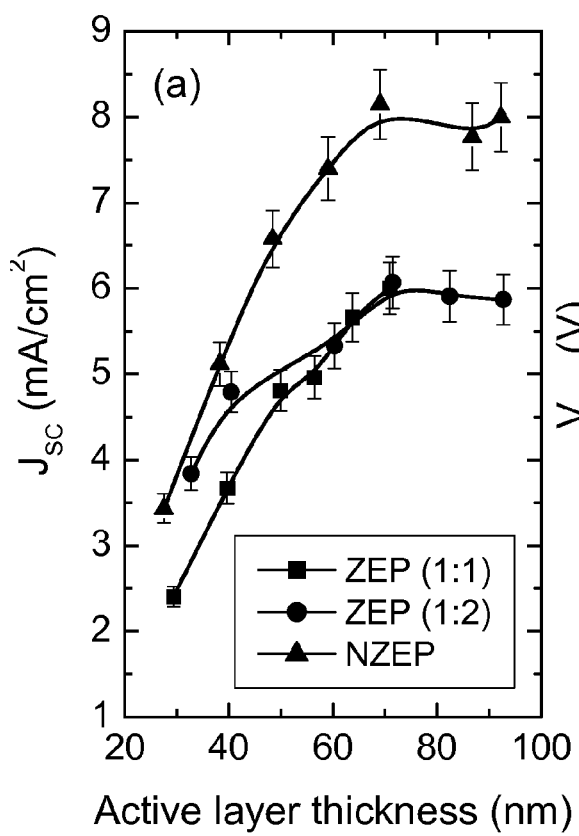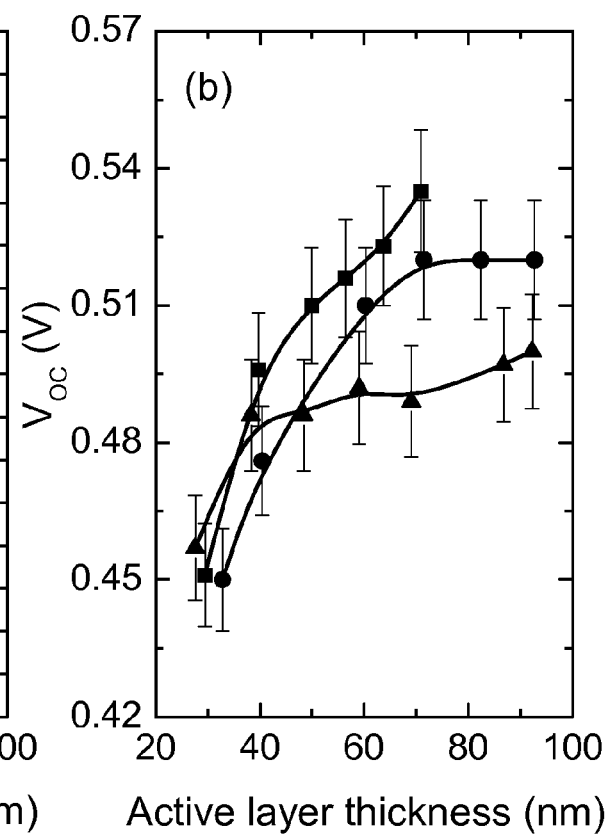
FIG. 10A
FIG. 10B

US 8,847,066 B2

GRADED ORGANIC PHOTOVOLTAIC DEVICE

CROSS-REFERENCE TO RELATED APPLICATIONS

This application claims priority from U.S. Provisional Application Ser. No. 61/216,643, filed on May 19, 2009, which is incorporated herein by reference in its entirety.

STATEMENT AS TO FEDERALLY SPONSORED RESEARCH

This invention was made with Government support under DMR-0212302, DMR-0819885, and CBET-0946723 awarded by National Science Foundation (NSF). The Government has certain rights in the invention.

TECHNICAL FIELD

This disclosure relates to graded organic photovoltaic devices and methods of making the same.

BACKGROUND

An organic photovoltaic device is a photovoltaic device that uses organic materials, such as conductive polymers or small organic molecules, to convert light into an electrical current. Organic photovoltaic devices can be used over a range of wavelengths for converting light into electrical energy. Organic photovoltaics devices have drawn interest for use as a source of renewable energy due to their potential compatibility with high throughput, roll-to-roll fabrication processes as well as low material cost. Conventional organic photovoltaic devices often utilize a planar heterojunction (PHJ) device architecture, in which two organic materials with dissimilar electronic properties are layered together.

FIG. 13 is an example of a planar heterojunction organic photovoltaic cell (OPV) 100. The organic photovoltaic cell 100 includes an anode 102, a cathode 104, a donor organic semiconductor layer 106 and an acceptor organic semiconductor layer 108. In an organic semiconductor, photon absorption can lead to the formation of tightly bound, mobile electron-hole pairs known as excitons. Excitons generated in either the donor or acceptor layers 106, 108 diffuse to an interface 110 between the layers. This interface is known as a donor-acceptor (D-A) heterojunction. Due to differences in electron affinity and ionization energy between the donor layer 106 and acceptor layer 108, an energy level offset exists at the interface. If this offset exceeds the exciton binding energy (i.e., the energy required to bind the electron-hole pair together), the excitons can dissociate. Following dissociation, the electron and hole charge carriers can be collected at their respective electrodes.

SUMMARY

In general, one aspect of the subject matter described in this specification can be embodied in a photovoltaic device that includes a first heterojunction layer, the first heterojunction layer having a first donor type organic material and a first acceptor type organic material, in which a concentration of at least one of the first donor type organic material and the first acceptor type organic material is graded continuously from a first side of the first heterojunction layer to a second side of the first heterojunction layer.

These and other embodiments can optionally include one or more of the following features. For example, in some implementations, the concentration of at least one of the first donor type organic material and the first acceptor type organic material is non-zero at one of the first side and the second side of the first heterojunction layer.

In some implementations, the concentration of at least one of the first donor type organic material and the first acceptor type organic material is non-zero at both the first side and the second side of the first heterojunction layer.

In some cases, the concentration of both the first donor type organic material and the first acceptor type organic material are graded continuously from the first side of the first heterojunction layer to the second side of the first heterojunction layer.

In certain implementations, a composition profile of at least one of the first donor type organic material and the first acceptor type organic material is linearly graded.

In some cases, the photovoltaic device further includes an anode layer and a cathode layer, in which the first heterojunction layer is between the anode layer and the cathode layer. The photovoltaic device may also include a charge blocking layer between the cathode layer and the first heterojunction layer or between the anode layer and the first heterojunction layer. The charge blocking layer between the anode layer and the first heterojunction layer can be molybdenum oxide. The charge blocking layer between the cathode layer and the first heterojunction layer can be bathocuproine.

In some implementations, the first heterojunction layer further includes a second donor type organic material. In some cases, the concentration of the second donor type organic material is graded continuously from the first side of the first heterojunction layer to the second side of the first heterojunction layer.

In some implementations, the photovoltaic device includes a second acceptor type organic material. A concentration of the second acceptor type organic material can be graded continuously from the first side of the first heterojunction layer to the second side of the first heterojunction layer.

In some cases, the photovoltaic device includes a second heterojunction layer adjacent to the first heterojunction layer, the second heterojunction layer comprising a second donor type organic material and a second acceptor type organic material, in which a concentration of at least one of the second donor type organic material and the second acceptor type organic material is graded continuously from a first side of the second heterojunction layer to a second side of the second heterojunction layer. The photovoltaic device can further include a charge coupling layer between the first heterojunction layer and the second heterojunction layer. The first heterojunction layer and the second heterojunction layer can be arranged in a stack and are electrically coupled in series. The first heterojunction layer and the second heterojunction layer can be arranged side by side and electrically coupled in parallel.

In another aspect, a method of fabricating a photovoltaic device includes depositing a first donor type organic material and a first acceptor type organic material on a substrate to provide a first heterojunction layer, in which a concentration of at least one of the first donor type organic material and the first acceptor type organic material is graded continuously from a first side of the first heterojunction layer to a second side of the first heterojunction layer.

In some implementations, depositing the first donor type organic material and the first acceptor type organic material comprises depositing a non-zero concentration of at least one of the first donor type organic material and the first acceptor type organic material at the first side or the second side of the first heterojunction layer. In some cases, the method further includes depositing a second donor type organic material and a second acceptor type organic material on the first heterojunction layer to provide a second heterojunction layer. In some cases, the method further includes annealing the photovoltaic device.

Exciton diffusion efficiency is the fraction of photogenerated excitons that reach a donor-acceptor interface.

Charge collection efficiency is the fraction of dissociated charge carriers that reach their respective electrodes.

The invention provides several advantages. For example, in some implementations, the graded architecture permits an enhancement in the power conversion efficiency of organic photovoltaic cells relative to other conventional architectures. These efficient photovoltaic cells could be produced cheaply in order to generate electricity on a large scale. In some implementations, the graded architecture permits an increase in the exciton diffusion, charge collection efficiency and/or the photon absorption efficiency of the device.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages will be apparent from the figures and the following detailed description, and from the claims.

BRIEF DESCRIPTION OF THE DRAWINGS

FIGS. 9-12 are graphs showing operating parameters of OPV devices.

DETAILED DESCRIPTION

In a planar heterojunction OPVs, the thickness of each of the active layers (i.e., the donor and acceptor layers) is preferably comparable to the exciton diffusion length (LD) so that excitons can reach the heterojunction interface. However, the exciton diffusion length is typically much smaller than the optical absorption length for photons. Accordingly, increasing the active layers thicknesses may lead to an increase in the absorption of photons while simultaneously decreasing the exciton diffusion efficiency, i.e., the number of excitons that can reach the heterojunction interface. In some cases, this "exciton bottleneck" may limit the overall OPV efficiency.

A graded donor-acceptor heterojunction is a type of device architecture for OPVs in which a concentration of the donor and/or acceptor molecular species in the device active layer is graded from a first side of the active layer to a second opposite side of the active layer. In some implementations, the graded architecture permits an increase in the exciton diffusion, charge collection efficiency and/or the photon absorption efficiency of the device.

Figure 1:
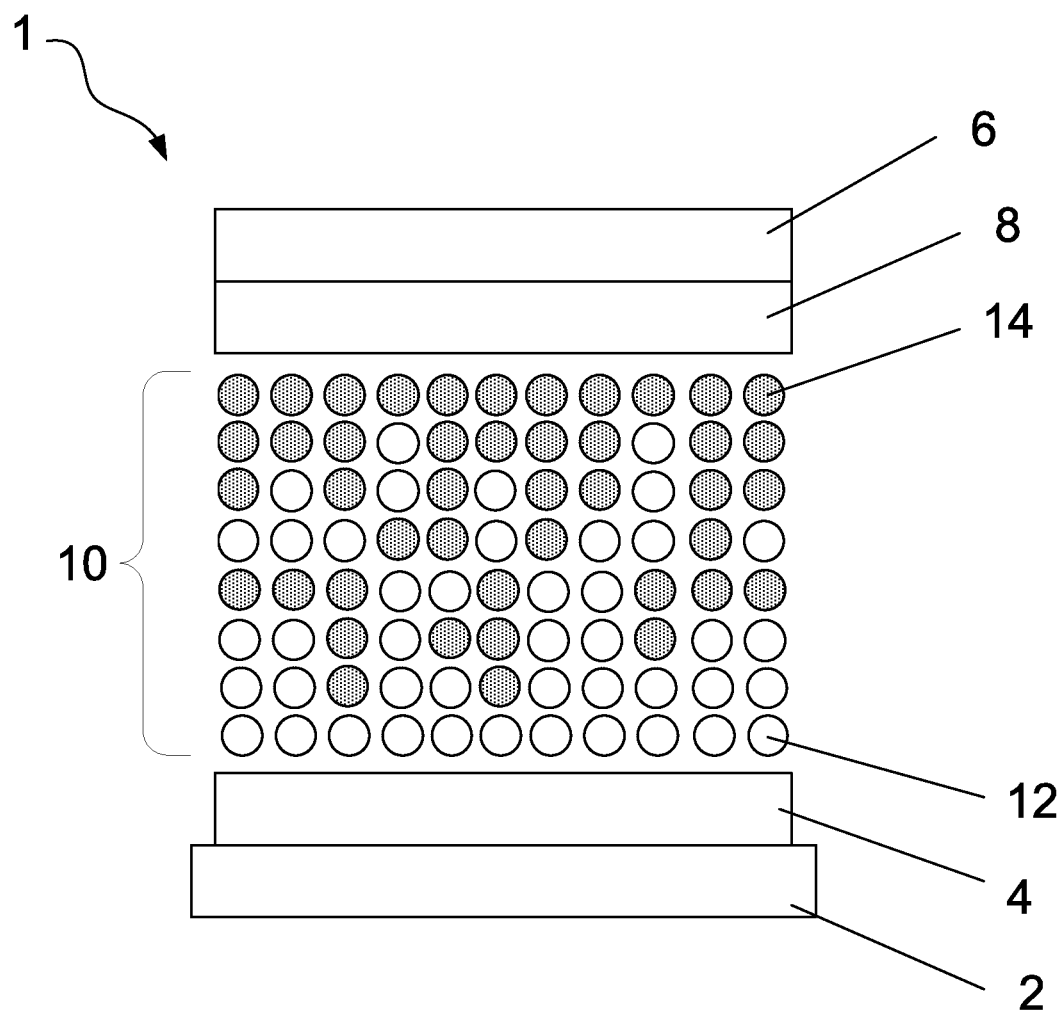
FIGS. 1-2, 4-6 and 8 are cross-sections of example OPV devices that include graded donor-acceptor heterojunctions.
Figure 13:
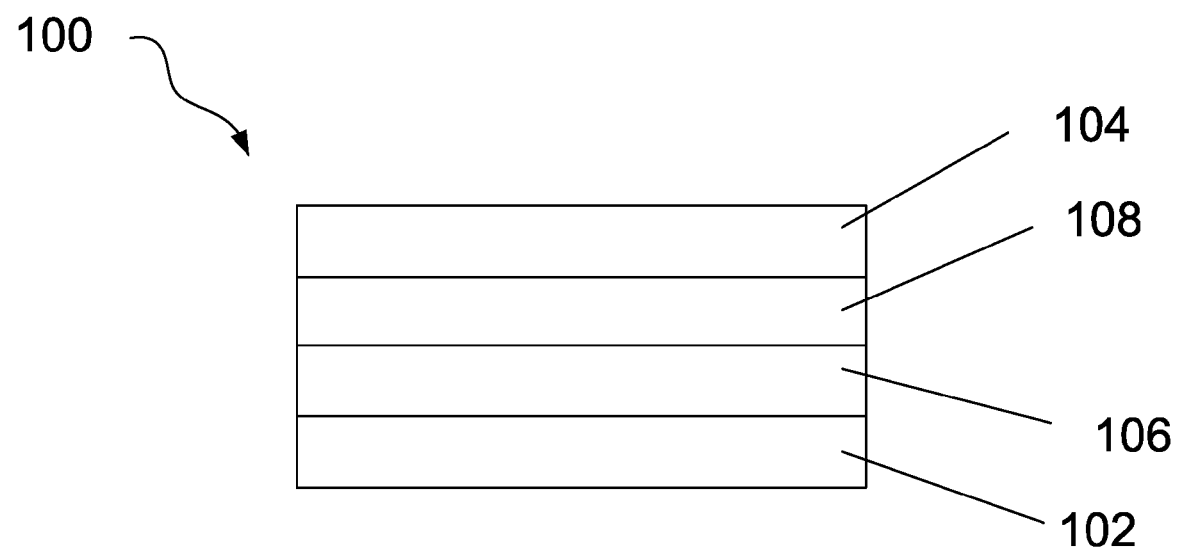
FIG. 13 is a cross-section of an example OPV device.

FIG. 1 is an example of an OPV 1 that includes a graded donor-acceptor heterojunction. As shown in the example, the photovoltaic device 1 includes an anode 4, a cathode 6, a first interlayer 8, such as an electron blocking layer, and an active layer 10. The foregoing layers can be formed on or in contact with an optional substrate 2. In contrast to the planar heterojunction device shown in FIG. 13, the active layer 10 of the OPV 1 is a graded donor-acceptor heterojunction that includes a mixture of a donor organic semiconductor material 12 and an acceptor organic semiconductor material 14, in which the individual molecules of the donor material 12 and acceptor material 14 are respectively represented by clear and dot patterned circles. It should be noted that the example shown in FIG. 1 is a simplified representation of an OPV device and the donor and acceptor molecules may not align as precisely as shown in the example, and need not be spherical in shape. In the graded donor-acceptor heterojunction layer 10, the composition of each of the organic donor and acceptor semiconductor materials 12, 14 is continuously graded from a first side of the active layer 10 to a second opposite side of the active layer 10.

As with the planar OPV, absorption of photons during operation of the device leads to the formation of an exciton in the donor or acceptor organic material. Given that the donor and acceptor materials 12, 14 are mixed rather than formed in separate planar layers, the total area of the donor-acceptor interface is larger than the corresponding donor-acceptor interface in a planar heterojunction device. Furthermore, excitons in the graded OPV may have a shorter distance to traverse before reaching the donor-acceptor interface where dissociation can occur, thus providing a higher exciton diffusion efficiency relative to planar heterojunction devices. Consequently, the graded heterojunction architecture enables, in some implementations, the use of a thicker active layer for increased photon absorption, without limiting the device efficiency. In addition, using a graded composition for the active layer as opposed to a random mixture of donor and acceptor material can, in some implementations, improve the charge carrier mobility through the active layer 10.

Each of the donor and acceptor material 12, 14 can include, but is not limited to, an organic material such as a small molecule or polymer. Examples of donor material that can be included in the active layer include phthalocyanines (examples: copper phthalocyanine (CuPc), tin-phthalocyanine (SnPc), lead phthalocyanine (PbPc), zinc phthalocyanine (ZnPc)), napthalocyanines (example: copper napthalcyanine (CuNc)), subphthalocyanines (example: boron subphthalocyanine chloride (SubPc), acenes (examples: pentacence, tetracene, rubrene), porphyrins (examples: platinum octaethyl prophyrin (PtOEP), platinum tetraphenylbenzoporphyrin (PtTPBP), tetraphenylporphyrin (TPP)), diamines (example: N,N'-di-1-naphthaleyl-N,N'-diphenyl-1,1'-biphenyl-4,4'-diamine), and thiophenes. Other organic materials may be used as well.

Examples of acceptor materials that can be included in the active layer include $C_{60}$, 3,4,9,10-perylenetetracarboxylic-bis-benzimidazole (PTCBI), and perylenetetracarboxylic dianhydride (PTCDA). Other organic materials may be used as well.

In some cases, the wavelength of light absorbed by the OPV 1 is determined by the band gaps of the donor and acceptor materials used for the active layer 10, where the respective band gap of each material corresponds to the difference between the material's highest occupied molecular orbital (HOMO) and lowest unoccupied molecular orbital (LUMO). Accordingly, the donor and acceptor materials can be selected to fabricate an OPV for absorbing light over particular wavelengths. For example, donors such as SnPc and PbPc can be used to absorb radiation in the infrared region of the electromagnetic spectrum. Donors including SubPc, pentacene and tetracene can be used with CuPc to absorb in the 450-750 nm wavelength range. In some implementations, more than one pair of donor-acceptor material can be incorporated into the graded active layer to increase the range of spectral responsivity of the OPV device. The thickness of the active layer 10 is substantially uniform and can be selected to be between about 1 nm to about 400 nm.

The interlayer 8 of the OPV 1 can include, for example, an electron blocking layer, a hole blocking layer, an electron transport layer, or a hole transport layer. A hole/electron transport layer can facilitate charge transport through the OPV 1 whereas a blocking layer can block charge carriers and excitons on a side of the active layer 10 to reduce device dark current and enhance device efficiency 10. However, in some implementations, a hole/electron transport layer may also block charge carriers. Similarly, in some implementations, a blocking layer also can facilitate charge transport through the OPV 1.

In some implementations, the interlayer 8 is positioned between the anode 4 and the graded heterojunction layer 10 instead of between the cathode 6 and the graded heterojunction layer 10. Although not shown, the OPV 1 can include one or more additional interlayers. For example, the OPV 1 can include a second interlayer between the anode 4 and the graded heterojunction layer 10. In another example, the OPV 1 can include a second interlayer above or below and in physical contact with the interlayer 8. Alternatively, or in addition, the OPV 1 can include two or more interlayers between the anode 4 and the graded heterojunction 10. The interlayer 8 can have a relatively uniform thickness. The thickness can be selected to be between about 1 nm and about 100 nm.

The interlayer 8 can include an organic or inorganic material. Examples of inorganic materials include molybdenum oxide ($MoO_3$). In a preferred implementation, a $MoO_3$ interlayer is positioned between the anode 4 and heterojunction layer 1. Examples of organic materials that can be included in the interlayer 8 include bathocuproine (BCP), poly(3,4-ethylenedioxythiophene):poly(styrenesulfonate) (PEDOT: PSS), copper phthalocyanine, 2-TNATA (4,4',4"-tris(2-naphthylphenylamino)triphenylamine), polyaniline, or any combination thereof. Other examples of organic materials include phenyl amines, such as, N,N'-diphenyl-N,N'-bis(3-methylphenyl)-(1,1'-biphenyl)-4,4'-diamine (poly-TPD), spiro-TPD, 4-4'-N,N'-dicarbazolyl-biphenyl (CBP), 4,4-bis[N-(1-naphthyl)-N-phenylamino]biphenyl (NPD), polypyrrole, poly(phenylene vinylene), aromatic tertiary amines, polynuclear aromatic tertiary amines, a 4,4'-bis(p-carbazolyl)-1,1'-biphenyl compound, an N,N,N',N'-tetraarylbenzidine. The interlayer 8 may be intrinsic (undoped) or doped. Doping may enhance the conductivity of the interlayer 8. Examples of dopants include, but are not limited to, Na, Li, or Cs. In some implementations, the OPV 1 does not include an interlayer 8.

To absorb photons impinging on the OPV 1, the anode layer 4 and/or cathode layer 6 are transparent to the wavelength(s) at which the active layer 10 will absorb radiation. For example, in some cases, the anode layer 4 and/or cathode layer 6 can include a layer of a transparent conductor such as indium tin oxide (ITO) for allowing light in the visible region of the electromagnetic spectrum (e.g., about 350 nm to about 750 nm) to pass into the device 1. In some implementations, at least one of the anode layer 4 or cathode layer 6 includes a non-transparent conductive material, such as, for example, aluminum. Other conductors can be used for the anode layer 4 and/or cathode layer 6, as well. The thicknesses of the anode layer 4 and cathode layer 14 are essentially uniform. The anode layer thickness can be between about 25 nm to about 300 nm thick whereas the cathode layer thickness can be between about 1 nm to about 1000 nm thick.

In some implementations the graded OPV 1 can include a transparent substrate 12 on which the organic and/or inorganic layers are formed. For example, the substrate 12 can be formed from materials such as glass or plastic, although other materials may be used. In some cases, the material which forms the substrate layer can be flexible.

An OPV in which the concentration of the donor material 12 (or acceptor material 14) is zero at an interface between the active layer 10 and an adjacent layer (i.e., the concentration of the acceptor material 14 (or donor material 12) is 100% at the first interface) is designated has having a "zero endpoint." An OPV in which the concentrations of both the donor material 12 and acceptor material 14 are non-zero at an interface between the active layer 10 and an adjacent layer is designated as having a "non-zero endpoint." The interface may correspond to an interface between the active layer 10 and any adjacent layer contacting the active layer 10, such as, for example, the anode layer 4 or the interlayer 8, as shown in FIG. 1. In some implementations, the OPV 1 can have a zero endpoint at both interfaces. In some other implementations, the OPV 1 can have a non-zero endpoint at both interfaces.

Figure 2:
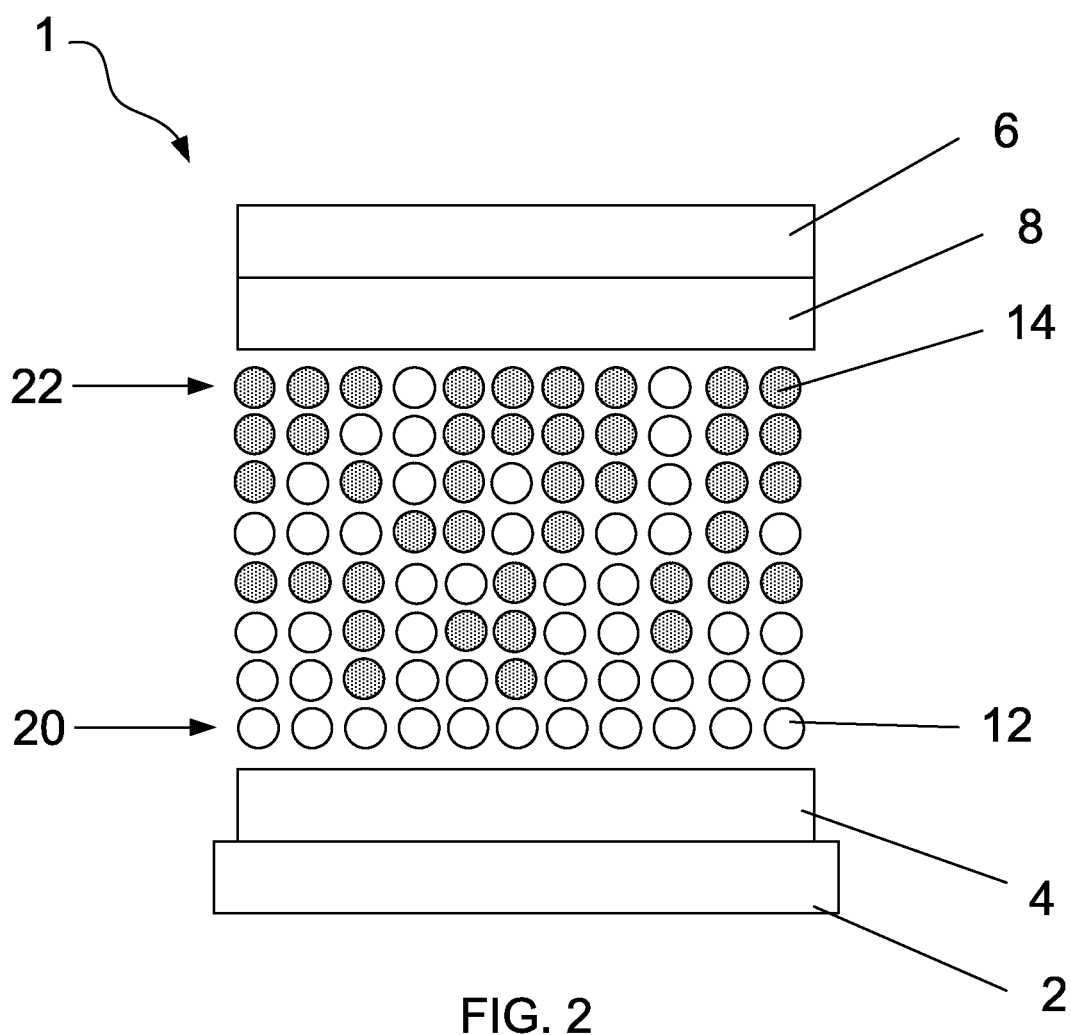

FIG. 2 is a cross-section of an example OPV structure in which an active layer 10 of the OPV 1 has a zero-endpoint acceptor concentration near a first interface 20. In particular, one or more of the molecular layers in the active region nearest to the anode layer 4 contain donor material 12, such as, for example, CuPc, but do not contain acceptor material 14. The concentration of the acceptor material 14, such as, for example, $C_{60}$, gradually increases, however, with increasing distance from the first interface 20 until the opposite interface 22 between the active layer 10 and the interlayer 8 is reached. In contrast, the concentration of the donor material 12 gradually decreases with increasing distance from the first interface 20 until the opposite interface 22 between the active layer 10 and the interlayer 8 is reached. The concentration of both the donor material 12 and acceptor material 14 at the opposite interface is non-zero. That is, one or more of the molecular layers in the active region 10 nearest the interface 22 includes at least some donor material 12 and some acceptor material 14.

Figure 3:
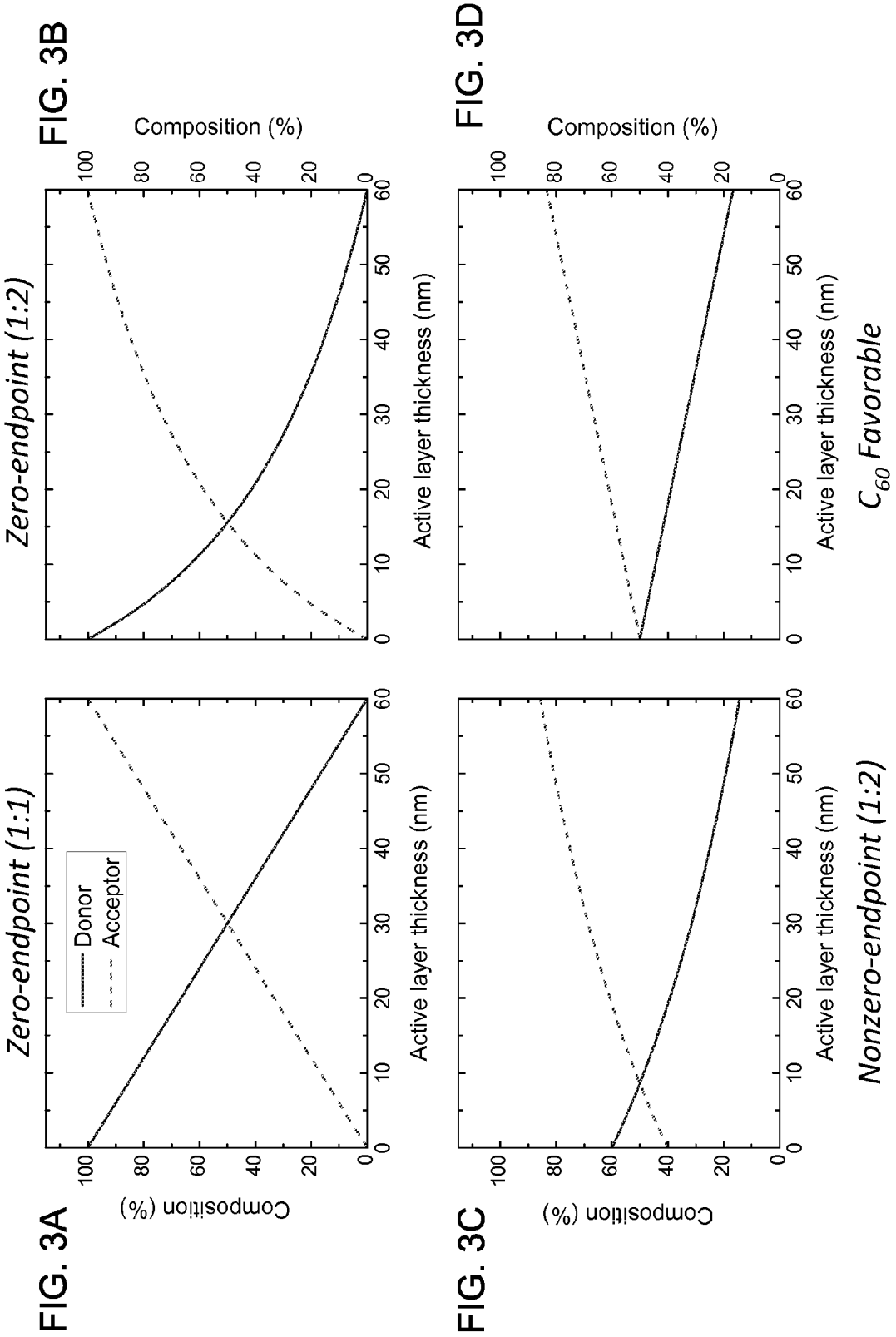
FIGS. 3A-3D are graphs that show composition profiles for acceptor material and donor material in an OPV device.

The composition profile of the acceptor material 14 and/or donor material 12 can vary over the thickness of the active layer 10. For example, in some implementations, the concentration of the acceptor material 14 and/or donor material 12 follows a linear increase or decrease over the thickness of the active layer 10. FIG. 3A is a graph that shows a composition profile for an acceptor material and donor material in a 60 nm thick active layer, in which the donor and acceptor concentrations are linearly graded. The left side of the graph represents the first interface between the active layer and a first adjacent layer of an OPV device. The composition of the active layer at this interface includes donor material but no acceptor material. Accordingly, this interface corresponds to a zero endpoint. The composition of the opposite interface of the active layer includes acceptor material but no donor material. Accordingly, this interface also corresponds to a zero endpoint.

Other composition profiles may be used as well. For example, in some implementations, the concentration of the acceptor material 14 and/or donor material follows a quadratic, or exponential graded profile. Alternatively, the composition profile of the active layer 10 may follow a combination of linear, quadratic and exponential profiles. FIG. 3B shows an example of a composition profile of an active layer of an OPV device having two zero endpoint interfaces, in which the composition profile of both the donor and acceptor materials follow a non-linear trajectory.

Figure 4:
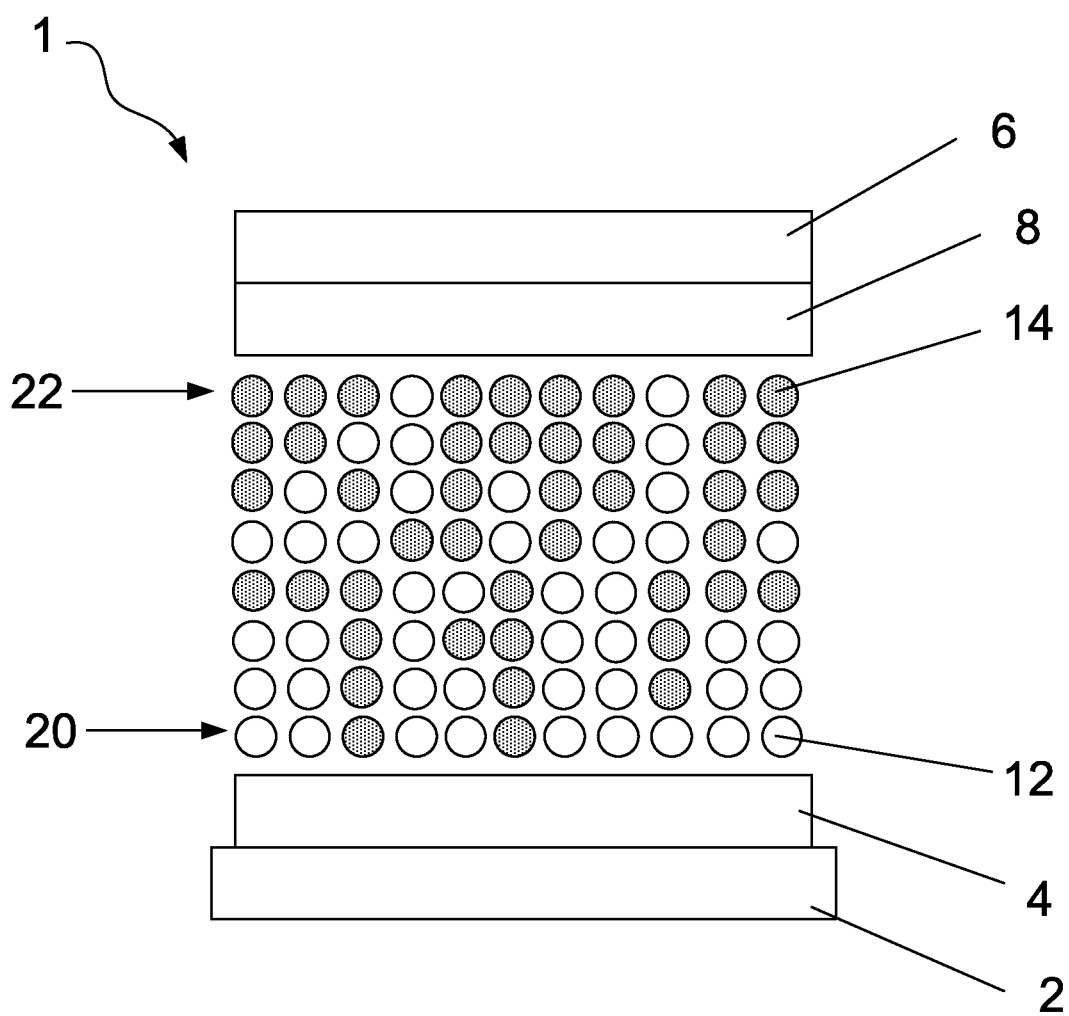

In some implementations, the active layer of the OPV device can have two non-zero endpoints. FIG. 4 shows an example of a simplified OPV structure in which an active layer 10 of the OPV 1 has a non-zero endpoint acceptor and donor material concentration near a first interface 20. In particular, one or more of the molecular layers in the active region nearest to the anode layer 4 contain both donor material 12 such as, for example, CuPc, and acceptor material 14 such as, for example, $C_{60}$. In the present example, the concentration of the acceptor material 14 gradually increases with increasing distance from the first interface 20 until the opposite interface 22 between the active layer 10 and the interlayer 8 is reached. In contrast, the concentration of the donor material 12 gradually decreases with increasing distance from the first interface 20 until the opposite interface 22 between the active layer 10 and the interlayer 8 is reached. The concentration of both the donor material 12 and acceptor material 14 at the opposite interface 22 is non-zero. That is, one or more of the molecular layers in the active region 10 nearest the interface 22 includes at least some donor material 12 and some acceptor material 14.

Similar to graded active layers having zero endpoints, the donor and acceptor material in a graded active layer having non-zero endpoints may have various concentration profiles across the thickness of the active layer 10. For example, FIG. 3C shows a composition profile of an active layer of an OPV device having two non-zero endpoint interfaces, in which the composition profile of both the donor and acceptor materials follow a linear trajectory. FIG. 3D shows a composition profile of an active layer of an OPV device having two non-zero endpoint interfaces, in which the composition profile of both the donor and acceptor materials follow a non-linear trajectory. In some implementations, the ratio of donor to acceptor material in the graded heterojunction layer can vary. In some cases, the amount of the donor material is greater than the amount of acceptor material, or alternatively, the amount of acceptor material is greater than the amount of donor material. For example, the composition of donor and acceptor material shown in FIG. 3C has a donor to acceptor weight ratio of 1:2, such that the composition is acceptor rich. Other ratios are possible as well. For example, the graded heterojunction layer can have donor to acceptor weight ratios including, but not limited to, 1:3, 1:4, 1:5, 2:1, 3:1, 4:1, 5:1, 2:3, or 3:2.

Figure 5:
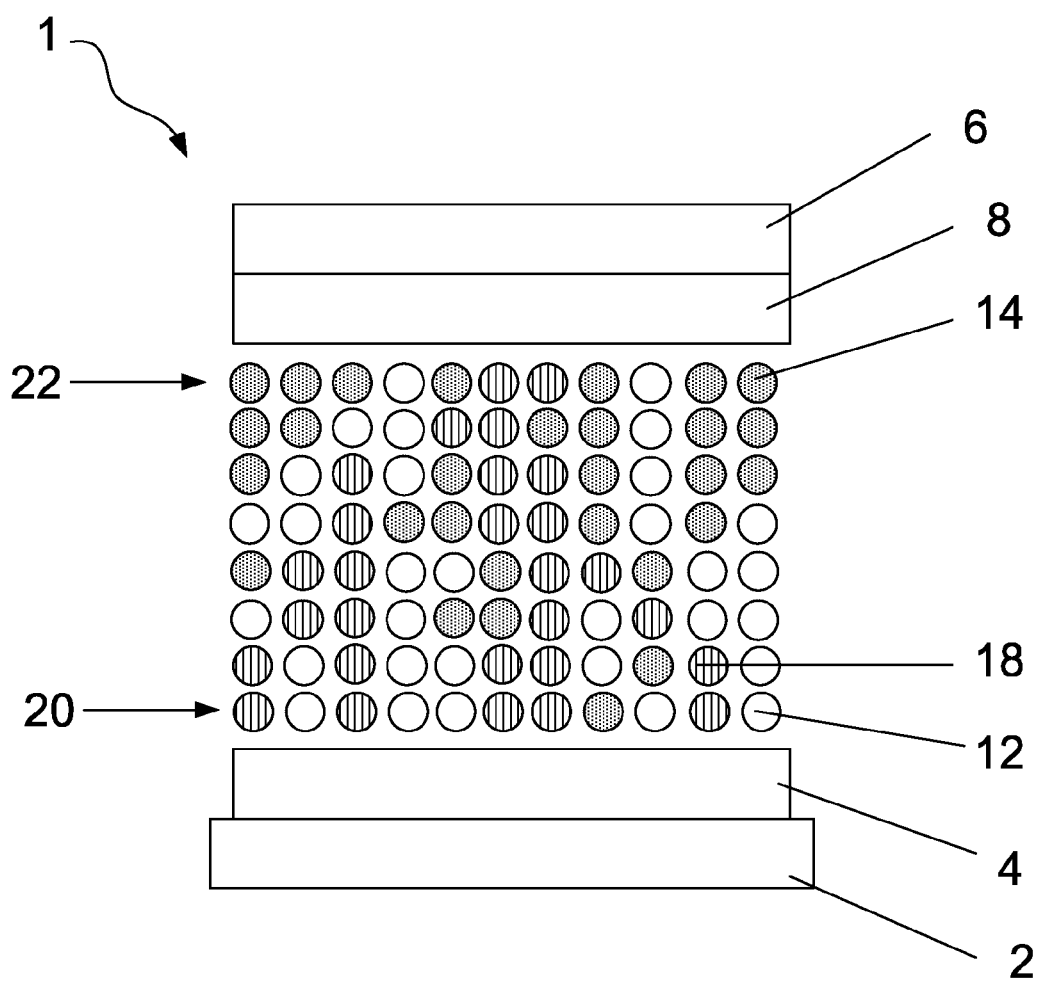

The composition of a graded active layer is not restricted to a single type of donor material and a single type of acceptor material. In some implementations, more than one type of donor material and/or more than one type of acceptor material can be included in a graded active layer of an OPV device. FIG. 5 shows an example of a simplified OPV structure in which an active layer 10 of the OPV 1 includes a first type of donor material 12, a second different type of donor material 18 and an acceptor material. For example, the first donor material 12 can be CuPc whereas the second donor material 18 can be SnPc. The acceptor material 14 can include, for example, $C_{60}$. The concentration of each of the donor materials and the acceptor material is non-zero at a first interface 20 between the active layer 10 and an adjacent anode layer 4. Similarly, the concentration of the donor materials and acceptor material is non-zero at the opposite interface 22 between the active layer 10 and an adjacent interlayer 8. In the present example, the concentration of both donor materials gradually decreases with increasing distance from the first interface 20. In contrast, the concentration of the acceptor material 14 gradually decreases with increasing distance from the first interface 20 until the opposite interface 22 between the active layer 10 and the interlayer 8 is reached.

In some implementations, multiple active layers can be combined into a single OPV device. For example, in some cases, multiple active layers can be stacked one on another. Alternatively, or in addition, multiple active layers can be arranged side by side. In some cases, the multiple active layers are electrically coupled in series or in parallel. FIG. 6 shows an example of a graded OPV device 1 having a tandem active layer structure. In the example of FIG. 6, a second graded active layer 24 is formed above a first graded active layer 10, in which the second graded active layer 24 is electrically coupled in series with the first graded active layer 10. Each of active layers 10 and 24 can include the same donor material 12 and the same acceptor material 14. Alternatively, the active layers 10, 24 can contain different donor material and/or different acceptor material. In some implementations, the first active layer 10 is separated from the second active layer 24 by a charge coupling layer 9. The charge coupling layer 9 can include various materials including metals like: Ag, Au, Al, Cu and metal oxides like: MoO3 and WoO3, for example, a metal, insulator, or semiconductor material. This layer can range in thickness from 0.1 nm to 50 nm.

Figure 6A:
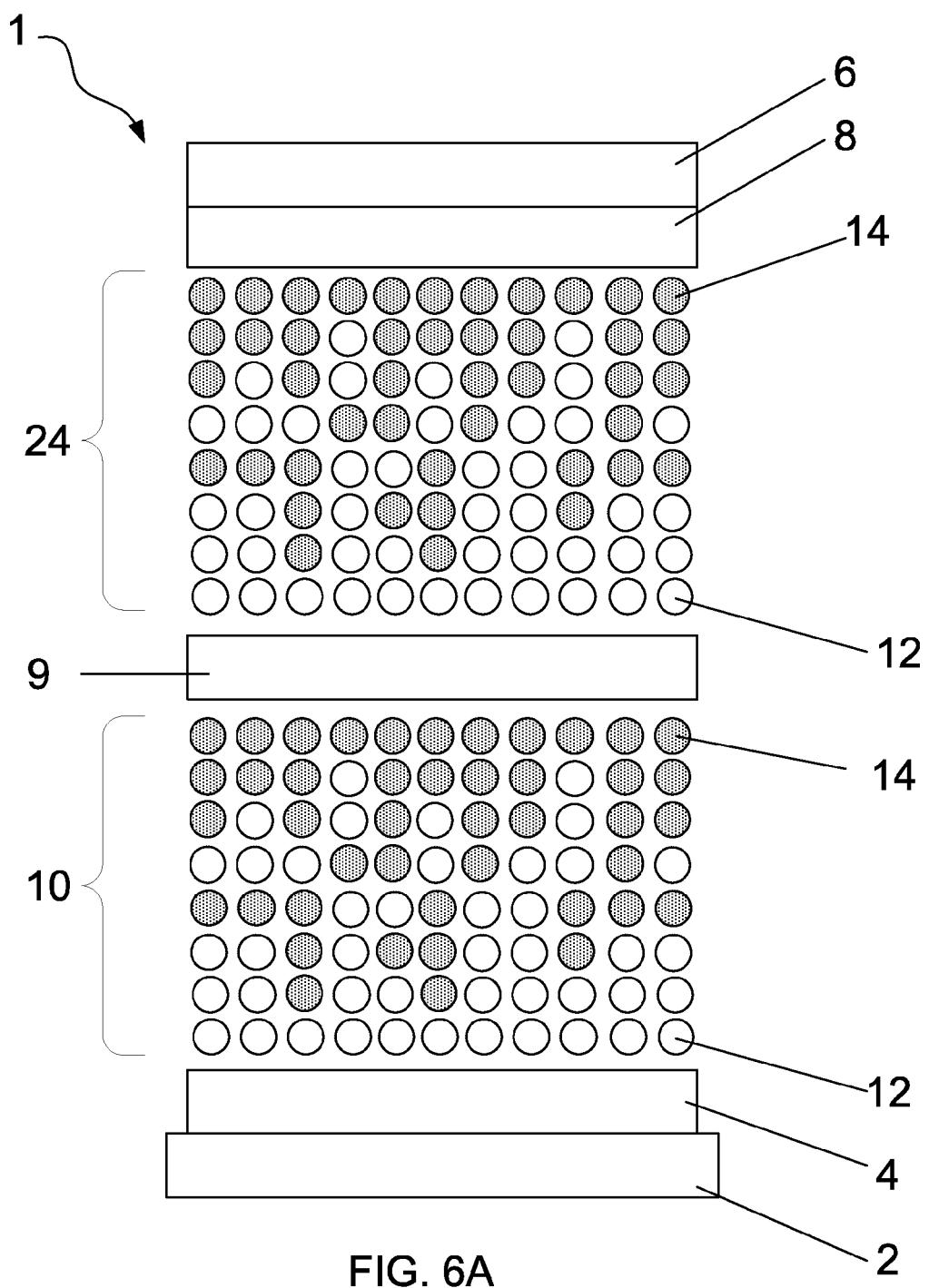

Stacking active layers in tandem as shown the example of FIG. 6A can, in some implementations, enable the OPV device 1 to absorb photons over a greater range of the electromagnetic spectrum. The tandem photovoltaic cells can include one or more optimized graded active layer cells fabricated with different donor-acceptor pairs which absorb in different regions of the solar spectrum. For example, the donor and acceptor materials in graded active layer 10 can be selected to primarily absorb photons in the visible region of the electromagnetic spectrum whereas the donor and acceptor materials in the second graded active layer 24 can be selected to primarily absorb photons in the near infrared (IR) region of the electromagnetic spectrum. The donor and acceptor materials can be selected to absorb photons in other regions of the electromagnetic spectrum as well including, but not limited to, the ultraviolet (UV) and far IR regions of the electromagnetic spectrum. More than two graded active layers can be stacked in an OPV device. For example, three or more graded active layers may be stacked in tandem. In this architecture, the currents generated in each subcell of the OPV flow in series to the opposing electrodes and therefore, the net current in the cell is limited by the smallest current generated by a particular subcell. In an optimized structure, the open-circuit voltage ($V_{OC}$) of the OPV is equal to the sum of the open-circuit voltages of the subcells.

In some implementations, a stacked OPV device can include other types of photovoltaic cells in addition to graded heterojunction active layers. For example, an OPV device containing multiple organic photovoltaic cells stacked in tandem can include a planar heterojunction active layer, similar to the planar organic active layer shown in FIG. 13, in which the planar heterojunction active layer is arranged above or below a graded active layer. Alternatively, a graded heterojunction active layer may be stacked in tandem with a mixed active layer, in which the composition profile of the donor and acceptor organic material is random, not graded. In some implementations, an OPV device can contain a graded heterojunction active layer, a planar heterojunction active layer, and a mixed active layer. Other configurations are possible as well.

Figure 6B:
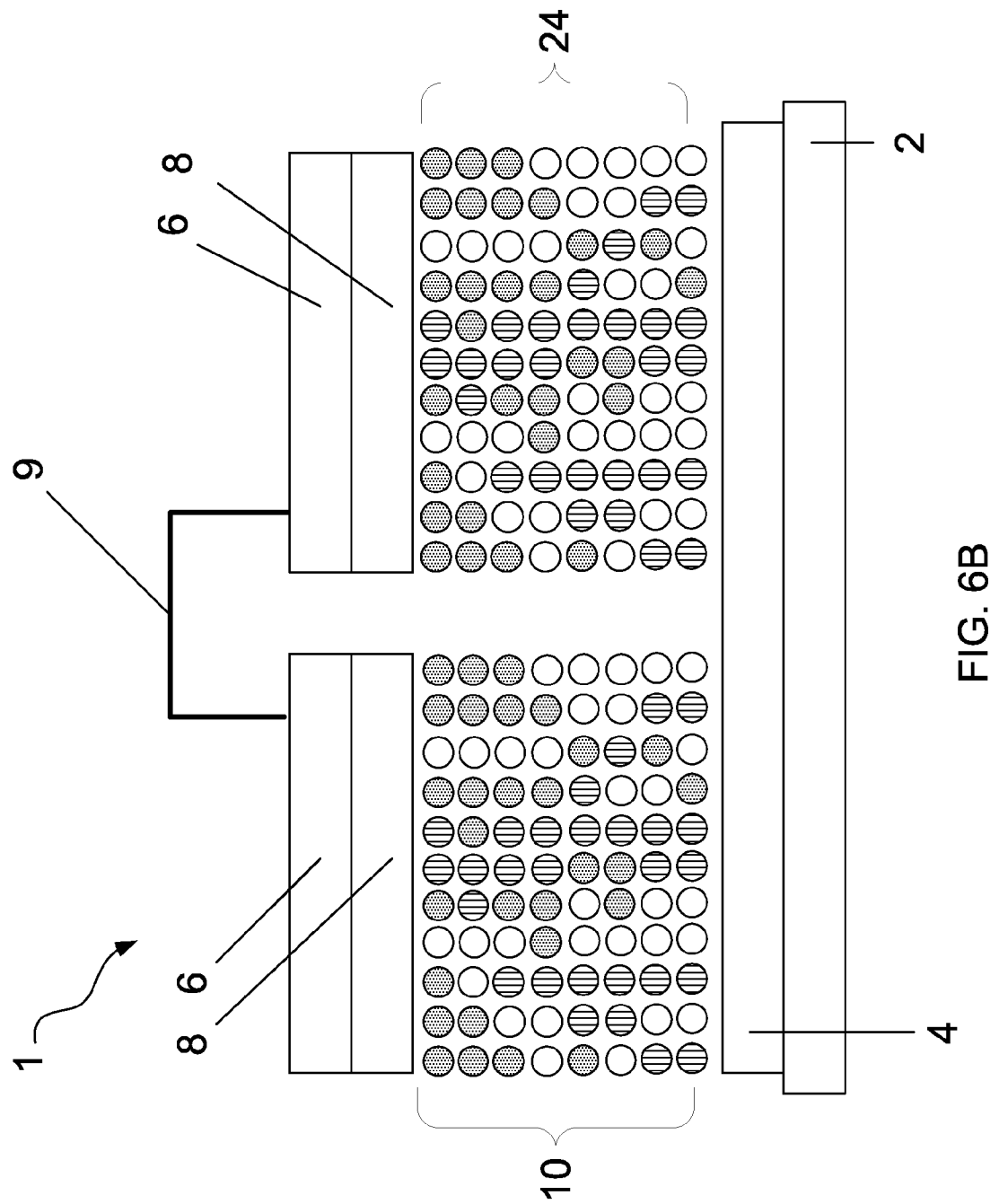

In some implementations, an OPV device can contain a graded heterojunction active layer arranged side by side with one or more other active layers, in which each of the active layers are electrically coupled in parallel. The one or more additional organic photovoltaic cells in the parallel configuration can include, for example, a graded active layer, a planar heterojunction active layer, or a mixed active layer. FIG. 6B is an example of an OPV device 1 that includes a first graded heterojunction layer 10 and a second graded heterojunction layer 24 arranged in parallel on a substrate 2. Each of the graded heterojunction active layers 10 and 24 can include the same donor material 12 and the same acceptor material 14. Alternatively, the graded heterojunction active layers 10, 24 can contain different donor material and/or different acceptor material. In some implementations, the anode 4 beneath the first graded active layer 10 is electrically coupled to the anode 4 beneath the second graded active layer 24. In the present example, a single anode 4 extends along the substrate 2. Similarly, the cathode 6 that is on top of the first graded active layer 10 can be electrically coupled to the cathode 6 on top of the second graded active layer 24 through a wiring layer 9. The charge coupling layers in the parallel configuration can include a conductive material such as, for example, ITO, gold, or aluminum. Other materials can be used to electrically couple the graded active layers to one another.

In some implementations, the OPV device can include other types of photovoltaic devices electrically coupled in series or in parallel with the graded active layer 10. For example, the OPV device can include a polymer photovoltaic device including but not limited to bulk heterojunction OPVs based on poly(3-hexylthiophene) (P3HT) and phenyl-C61-butyric acid methyl ester (PCBM). Alternatively, or in addition, the OPV device can include a photovoltaic device that contains nanoparticles in the active layer for absorbing and converting photons to electrical charge. Such nanoparticles can include, but are not limited to, semiconductor (group II-VI, III-V, IV) and metallic nanoparticles (Ag, Au, Cu). Alternatively, or in addition, the OPV device can include an inorganic photovoltaic device based on silicon, silicon-germanium, or group III-V materials such as InGa, InGaAs, InGaAs, InP, GaP, or InGaP.

Figure 7:
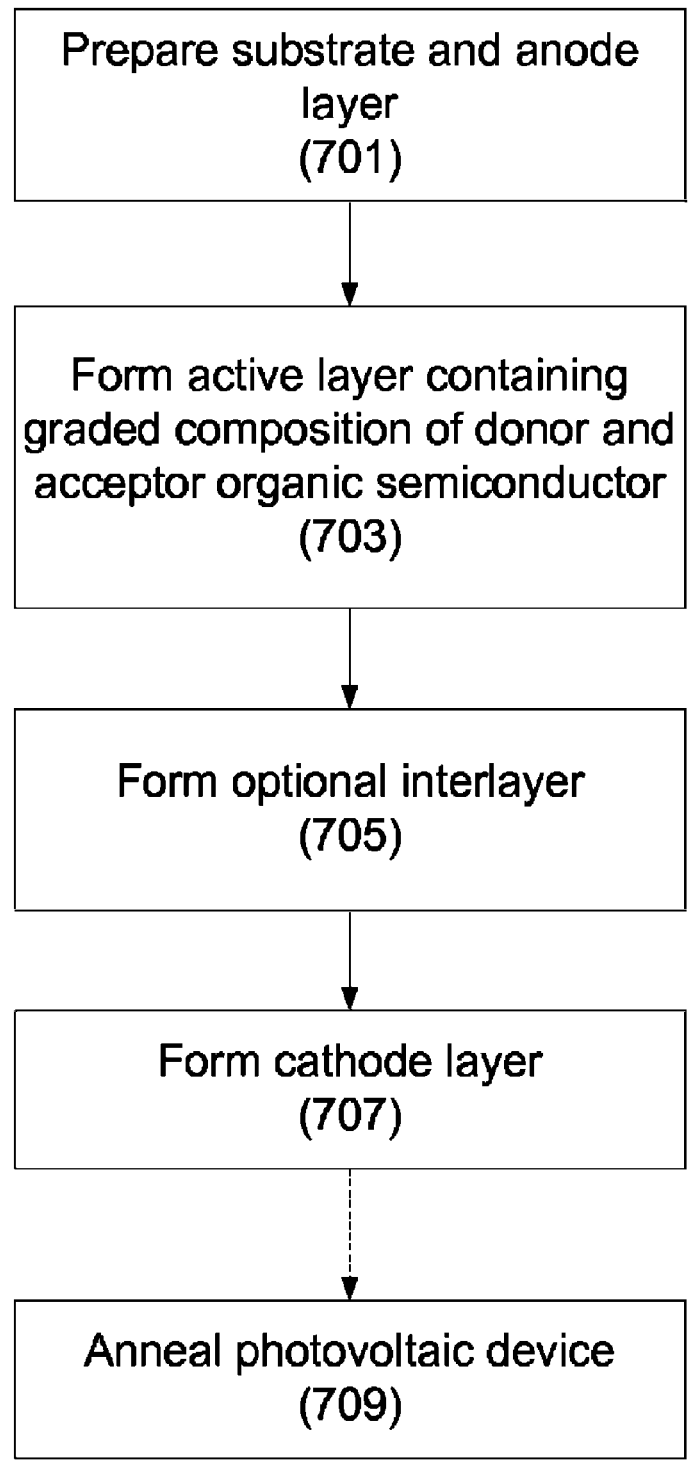
FIG. 7 is a flow chart depicting an example process for fabricating a graded heterojunction active layer OPV device.

FIG. 7 is a flow chart depicting an example process for fabricating a graded heterojunction active layer OPV device. As shown in FIG. 7, fabrication of the graded heterojunction OPV device can begin by preparing an optional substrate for deposition followed by forming the OPV anode layer (step 701). In an example, a glass-slide is used as a substrate and is prepared by sonicating in a tergitol solution for about 5 minutes, in de-ionized water for about 5 minutes, and twice in acetone for about 5 minutes each time. The glass-slide then is boiled twice in isopropyl alcohol for about 5 minutes before exposure to ultraviolet-ozone ambient for about 5 minutes. To fabricate the anode layer, an electrically conductive layer then is formed on the substrate. For example, a layer of ITO having a sheet resistance of $15\Omega/\square$ can be deposited on the glass-slide using thermal evaporation or radio-frequency (RF) sputtering, although alternative deposition techniques may be used as well. In some implementations, the substrate is pre-coated with the electrically conductive layer. For example, the glass slide is pre-coated with a layer of ITO prior to the foregoing cleaning steps. Transparent or non-transparent conductive material other than ITO, such as, for example, gold or aluminum, also may be deposited as the anode layer.

The heterojunction active layer then is formed on the anode layer (step 703). To form the heterojunction active layer, the organic materials can be co-deposited using high-vacuum thermal evaporation. For example, the organic materials can be deposited at about $8\times10^{-7}$ Torr. The growth rate of each of graded heterojunction layer is measured using a quartz crystal monitor. For growing an active layer in which the composition of the constituent materials is graded, two different material sources in the chamber are used. The deposition rate of each material is computer controlled permitting the growth of films with compositions which vary over the film thickness. In some implementations, the gradients of the donor and acceptor material concentration are characterized by the corresponding material growth rate. In an example, a graded heterojunction active layer can be formed with CuPc and $C_{60}$ in which the growth rate of CuPc is gradually decreased from 2 Å/s at the beginning of the deposition process to 0 Å/s at the end of the deposition process. In contrast, the growth rate of $C_{60}$ is 0 Å/s at the beginning of the deposition process and 2 Å/s at the end of the deposition process. In another example, $C_{60}$ is gradually decreased from 1 Å/s to 0 Å/s whereas CuPc is increased from 0 Å/s to 2 Å/s. The former example has a 1:1 by weight ratio of CuPc:$C_{60}$ and the latter example has a 1:2 by weight ratio $C_{60}$:CuPc. Alternatively, in some implementations, the deposition rate of the donor and acceptor material is kept constant while a substrate holder, which holds the OPV device being fabricated, is moved from one side of the growth chamber near the first material source to a second side of the growth chamber near the second material source. In this way, the growth rate of the donor and acceptor material is adjusted by changing the speed at which the substrate holder moves.

If additional types of donor or acceptor material are desired in the active layer, additional material sources may be added to the source chamber. Deposition techniques other than high-vacuum thermal evaporation also may be used. For example, deposition techniques including, but not limited to, solution deposition, sublimation, vapor-phase deposition, vapor-jet deposition, or molecular-beam deposition may be used to deposit the organic material employed in the heterojunction active layer.

Figure 8:
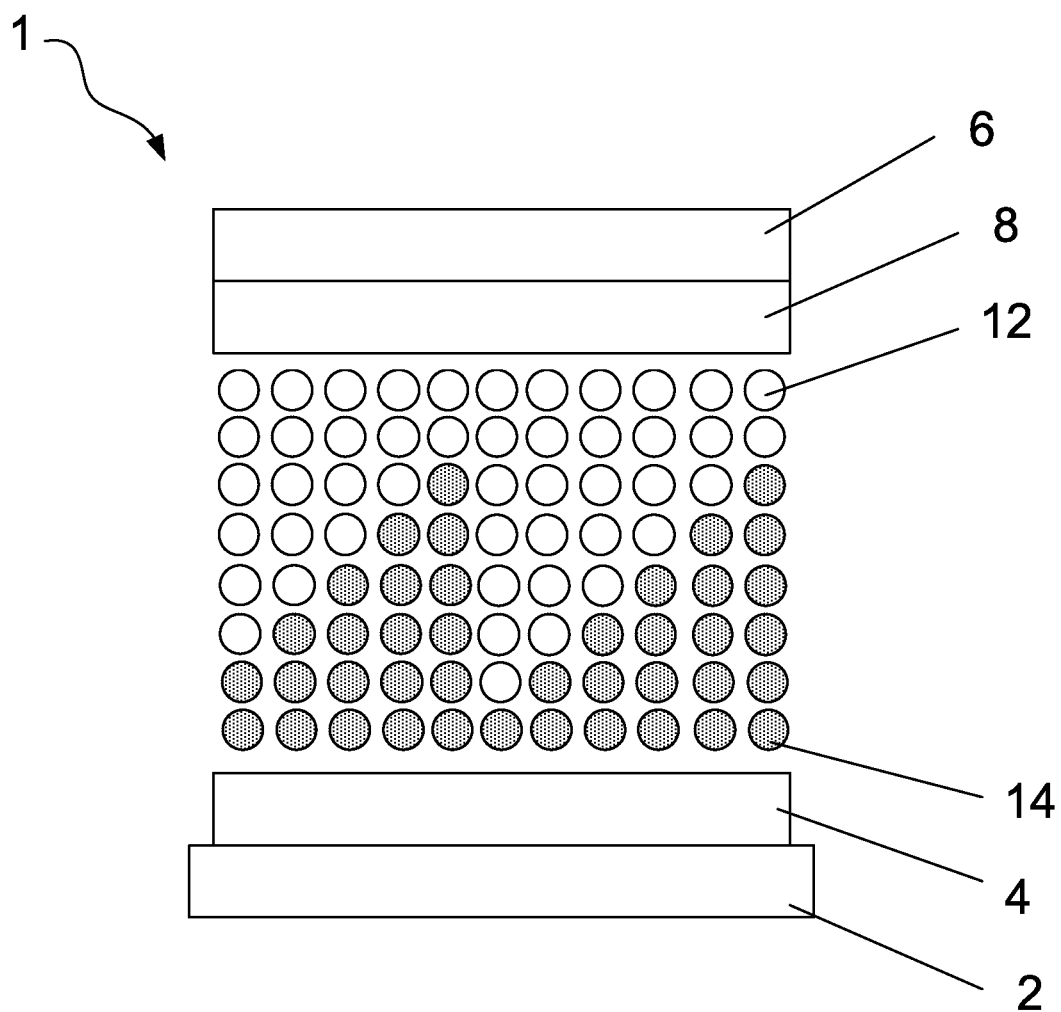

In some implementations, the donor and acceptor materials are deposited at different times instead of co-deposited simultaneously. For example, in some implementations, either a first donor or acceptor material is deposited, in which the donor and acceptor material is nanoporous. Such deposition can be performed using block co-polymer templating, solution deposition or growth conditions that lead to dense nanowire shaped morphologies. Following the deposition, the second donor or acceptor material is then deposited on the first donor or acceptor material to back fill the openings in the first donor or acceptor material. An example cross-section of a graded heterojunction active layer OPV device formed by depositing the donor and acceptor material at separate times is shown in FIG. 8. As shown in the example of FIG. 8, a nanoporous acceptor material 14 has been deposited and contains grooves and/or ridges which have been back-filled with the donor material 12.

Referring again to FIG. 7, following the deposition of the graded heterojunction active layer, one or more optional interlayers may be formed in contact with the active layer (step 705). The one or more interlayers include, for example, a charge blocking layer, a charge transport layer, or any combination thereof. The interlayer may be formed of organic or inorganic material and can be deposited using any of various deposition techniques including, but not limited to, deposition from solution, thermal evaporation, sublimation, RF sputtering, vapor-phase deposition, vapor-jet deposition, and molecular-beam deposition.

Following the deposition of the graded heterojunction active layer or the one or more interlayers, a cathode can be deposited on the surface of the OPV device (step 707). The cathode layer can be a transparent or non-transparent electrically conductive material similar to the anode layer such as, for example, ITO, gold, or aluminum. The cathode layer can be deposited using any of various deposition techniques including, but not limited to, thermal evaporation an RF sputtering.

Following the deposition of the cathode layer, the entire OPV optionally can be annealed (step 709). The OPV device can be heated to temperatures, for example, in ranges of about 300 K to about 600 K, or about 373 K to about 423 K. In some implementations, the phase separation of the organic material annealing can create nanoscale interpenetrating networks of donor and acceptor domains with high crystalline order through the active layer, creating conduits for charge transport. In some cases, the interpenetrating networks of donor and acceptor domains exhibit charge collection efficiencies similar to the charge collection efficiencies of the bulk polymers that correspond to the donor and acceptor materials, respectively. Accordingly, the power conversion efficiency $\eta_P$ of the OPV devices can, in certain implementations, be improved.

Annealing can be performed at any step in the fabrication process following deposition of the graded heterojunction active layer. For example, the annealing procedure can be performed after preparing the anode layer and before depositing the heterojunction layer, after depositing the graded heterojunction active layer and before depositing an interlayer or cathode layer, or after depositing the one or more interlayers. In some cases, the device may be annealed at multiple times during fabrication.

EXAMPLES

The invention is further described in the following examples, which do not limit the scope of the invention described in the claims.

In order to investigate the performance of graded heterojunction OPV devices, several graded heterojunction devices were fabricated and compared with both planar heterojunction OPV devices and mixed heterojunction OPV devices. Photovoltaic (PV) characterization of the devices was done in air immediately after growth under simulated AM1.5G solar irradiance spectrum obtained from a 150 W Oriel solar simulator at 25° C. Current-voltage characteristics of the devices were measured using an Agilent Technologies Semiconductor Parameter Analyzer that sweeps voltage across the device and measures current through the device. These characteristics were measured as a function of optical illumination intensity by changing the neutral density filters. The external quantum efficiency of the OPV devices ($\eta_{EQE}$) was measured using monochromatic light chopped at a frequency of 200 Hz. Current measurements of the OPV devices were made at each wavelength using a lock-in amplifier referenced to the chopper frequency. The incident optical power was measured using a Newport model 818-UV Low Power detector. Reflectivity and transmission measurements were carried out using a JA Woolam ellipsometer.

FIG. 9A is a graph that compares the current density-voltage characteristics for planar heterojunction and uniformly mixed heterojunction OPV architectures. FIG. 9B is a graph that compares the current density-voltage characteristics for several example graded heterojunction OPV device architectures. In particular, FIG. 9B shows current density for graded heterojunction OPVs with active layers consisting of either a zero endpoint (ZEP) (1:1 by weight), ZEP (1:2 by weight), non-zero endpoint (NZEP), or C60-favorable gradient. The ZEP (1:1) gradient was constructed by varying the growth rates (R) of CuPc and $C_{60}$ according to $R_{CuPc}$=0.2 nm/s→0 nm/s and $R_{C60}$=0 nm/s→0.2 nm/s, respectively. The ZEP (1:2) was constructed by varying the growth rates according to $R_{CuPc}$=0.1 nm/s→0 nm/s and $R_{C60}$=0 nm/s→0.2 nm/s, respectively. The non-zero NZEP gradient was constructed by varying the growth rates according to $R_{CuPc}$=0.075 nm/s→0.025 nm/s and $R_{C60}$=0.05 nm/s→0.15 nm/s, respectively. The NZEP gradient has a 1:2 ratio of CuPc to $C_{60}$. A modified version of the non-zero endpoint is the "C60-favorable" gradient, which maintains a composition of ≥50 wt. % C60 throughout the gradient heterojunction. The C60-favorable gradient was constructed by varying the growth rates according to $R_{CuPc}$=0.1 nm/s→0.033 nm/s and $R_{C60}$=0.1 nm/s→0.167 nm/s, respectively. The dark current for graded heterojunction OPVs is generally lower than that of conventional planar and mixed architectures. The dark current in an OPV can be modeled using the Shockley equation:

$$J = J_s \left\{ \exp\left(\frac{q(V - JR_s)}{nkT}\right) - 1 \right\} \quad (1)$$

where J and $J_s$ are the current density and reverse-bias saturation current density, q is the electron charge, $R_s$ is the series resistance, n is the ideality factor, k is Boltzmann's constant, and T is the temperature. For example, Table 1 shows experimental values of the ideality factor which is reduced from 1.95 for the PHJ cell to 1.4 for the mixed heterojunction cell and about 1.6 for the zero endpoint (1:1) graded heterojunction cell.

TABLE 1

|  | N | Js (A/cm2) | Rs (Ωcm²) |
|---|---|---|---|
| Planar HJ (60 nm) | 1.95 | 5 * 10⁻⁷ | 01.02 |
| Mixed HJ (73 nm) | 1.4 | 4 * 10⁻⁹ | 0.48 |
| Zero E.P. (1:1) 29 nm | 1.87 | 1.9 * 10⁻⁷ | 0.44 |
| Zero E.P. (1:1) 39.7 nm | 1.72 | 4 * 10⁻⁸ | 0.48 |
| Zero E.P. (1:1) 50 nm | 1.7 | 3 * 10⁻⁸ | 0.76 |
| Zero E.P. (1:1) 70.9 nm | 1.64 | 6.6 * 10⁻⁹ | 1.48 |
| Non-zero E.P. (1:2) 69 nm | 1.51 | 6.8 * 10⁻⁹ | 0.93 |

The $J_s$ value in the mixed and graded heterojunction architectures can be lower relative to the planar heterojunction architecture due to lower mobilities for holes in the donor and for electrons in the acceptor layer due to molecular intermixing. The $J_s$ value decreases from 1.9E⁻⁷ A/cm² to 6.6E⁻⁹ A/cm² as thickness increases from 29 nm to 70 nm for zero-endpoint (1:1) grading. The $R_s$ value increases from 0.44 Ωcm² to 1.48 Ωcm² for the same increase in thickness. The decrease in the magnitude of $J_s$ by two orders of magnitude and the concomitant increase in the $R_s$ value could suggest that the charge collection efficiency decreases as thickness increases.

Figure 11A:
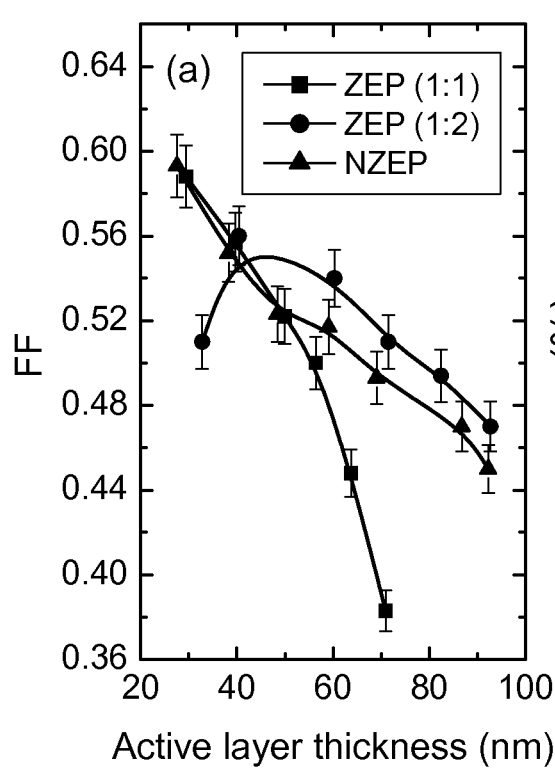
Figure 11B:
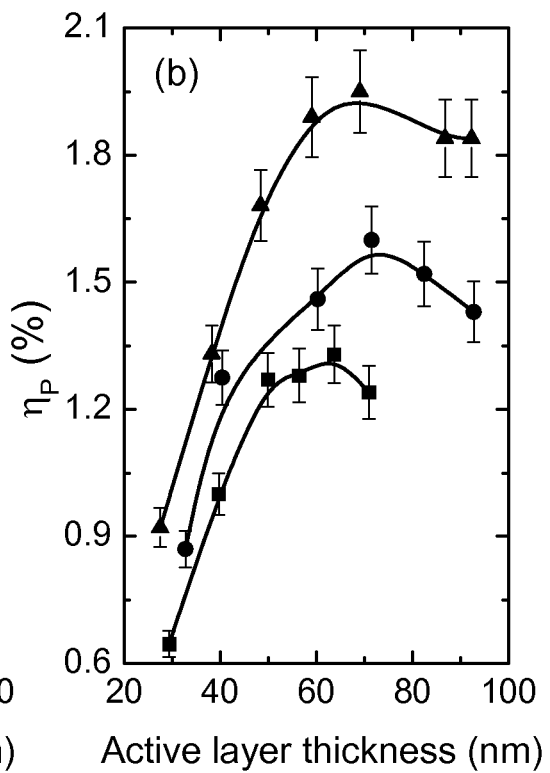

In order to investigate the performance of graded heterojunction OPVs relative to mixed layer OPVs, the dependence of device performance on active layer thickness can be examined. An equal and uniform mixture of CuPc:$C_{60}$ was used as a reference for comparison with graded heterojunction OPVs. FIGS. 10 and 11 show operating parameters for OPV devices with ZEP (1:1), ZEP (1:2) and NZEP graded heterojunctions as a function of active layer thickness under simulated AM1.5G solar illumination at 100 mW/cm2. As shown in FIG. 10A, the short-circuit current density ($J_{SC}$) increases with thickness for all three gradients. The $J_{SC}$ values are lower for the ZEP architectures relative to the NZEP architecture. As shown in FIG. 10B, the open-circuit voltage ($V_{OC}$) does not depend strongly on GHJ type, and in general increases with active layer thickness. As shown in FIG. 11A, the fill factor (FF) for all three GHJs decreases with increasing thickness. The FF increases significantly upon changing the CuPc:$C_{60}$ ratio from 1:1 to 1:2. This high FF is also observed for the NZEP gradient which is characterized by a 1:2 ratio of CuPc to $C_{60}$. As shown in FIG. 11B, together these parameters result in a power efficiency $\eta p$ of $(2.0\pm0.1)$ % for the NZEP graded architecture at an active layer thickness of 69 nm.

FIGS. 10-11 show a strong correlation between GHJ OPV performance and active layer thickness. For the ZEP (1:1), ZEP (1:2) and NZEP GHJs, the $J_{SC}$ increases with thickness as a result of increasing optical absorption. The low $J_{SC}$ values observed for the ZEP architectures result from a low exciton diffusion efficiency at the edges of the GHJ. The exciton diffusion efficiency is improved by adjusting the ZEP gradient to the NZEP architecture, increasing the donor acceptor interface area near the anode/GHJ and GHJ/BCP interfaces. The improvement in exciton diffusion efficiency for the NZEP gradient results in an increase in $J_{SC}$ relative to the ZEP GHJs. The $V_{OC}$ increases with thickness as a result of increased photocurrent and reduced dark current with increasing active layer thickness. The FF for all three GHJs decreases with increasing thickness, reflecting a reduction in the charge collection efficiency, which is further supported by the observed reduction in $J_s$. The increase in the GHJ FF upon changing the CuPc:$C_{60}$ ratio from 1:1 to 1:2 indicates that the charge collection is initially limited by electron transport. This observation is further supported by the increase in FF observed for the NZEP gradient which contains 1:2 CuPc:$C_{60}$.

Figure 12A:
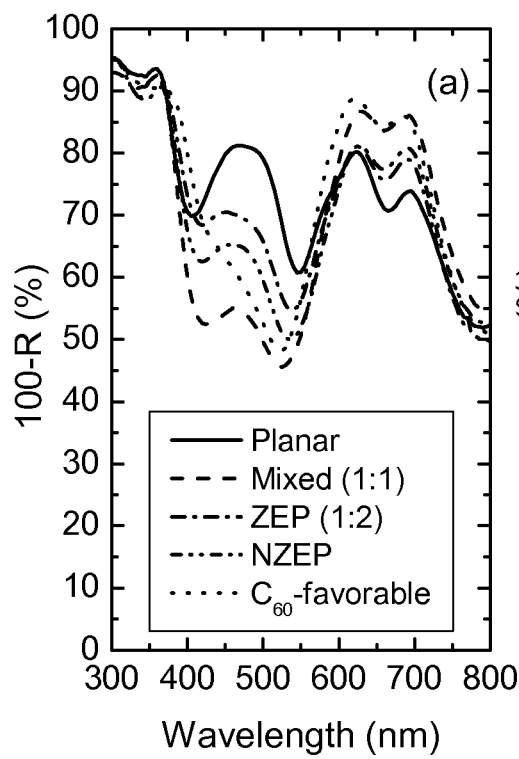
Figure 12B:
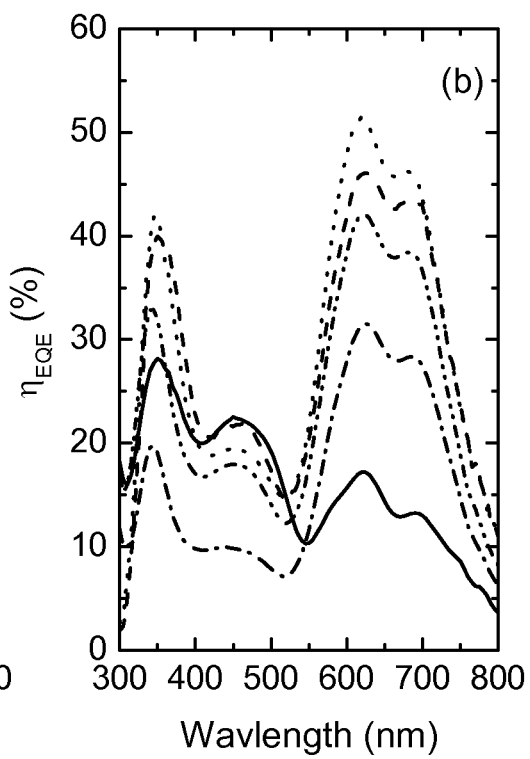

The spectral response of GHJ OPVs was compared to that of conventional planar and uniformly mixed device architectures. The relative absorption efficiency for each OPV was estimated by measuring normal incidence device transmissivity and reflectivity (R) at an angle of 15° from normal. Since transmissivity through the opaque metal cathode is about $10^{-4}$, the relative absorption efficiency can be approximated as 100-R (%). FIGS. 12A and 12B show the relative absorption and $\eta_{EQE}$ spectra for planar, mixed (1:1), and a variety of GHJ OPVs. The active layer thicknesses for the mixed (1:1), ZEP (1:2), NZEP and $C_{60}$-favorable GHJ OPVs are 73 nm, 72 nm, 69 nm, and 71 nm, respectively. In all cases, the photoresponse occurring at wavelengths $\lambda \geq 525$ nm originates from absorption in CuPc. The device response observed at shorter wavelengths corresponds mainly to absorption in $C_{60}$. The use of graded and mixed heterojunctions drastically improves the $\eta_{EQE}$ of CuPc relative to a planar device. Both the ZEP (1:2) and NZEP architectures show a much lower $C_{60}$ response than the uniformly mixed heterojunction. An increase in $\eta_{EQE}$ is realized for the $C_{60}$-favorable gradient relative to both the NZEP gradient and a uniformly mixed device.

FIGS. 12A-12B compare the spectral response of planar, mixed (1:1), and a variety of GHJ OPVs. The use of graded and mixed heterojunctions leads to a significant enhancement in the response from CuPc relative to a planar device due to the short $L_D$ in this material. The lower $\eta_{EQE}$ observed for $C_{60}$ in the ZEP (1:2) and NZEP GHJs compared to a mixed heterojunction device suggests that the product of the exciton diffusion and charge collection efficiencies for $C_{60}$ is smaller in these unoptimized gradients than in the mixture. The NZEP gradient was modified to ensure that the $C_{60}$ component of the GHJ remains $\geq 50$ wt. % throughout the film. An increase in $\eta_{EQE}$ is realized using the $C_{60}$-favorable gradient, which relative to the NZEP gradient has optimized exciton diffusion and charge collection efficiencies for both active materials. Compared to a uniformly mixed OPV, the $C_{60}$-favorable gradient shows about a 25% increase in the CuPc response at $\lambda$ of about 620 nm. Since these structures have comparable absorption efficiencies for CuPc, this improvement implies that the $C_{60}$-favorable architecture has a larger internal quantum efficiency than the uniformly mixed OPV. Given the high diffusion efficiency characteristic of a mixture, this result also indicates that the charge collection efficiency is larger in the $C_{60}$-favorable gradient than in a uniform mixture.

The foregoing represents examples of graded organic photovoltaic devices. A number of embodiments have been described. Nevertheless, it will be understood that various modifications may be made without departing from the spirit and scope of the present invention. Other aspects, advantages, and modifications are within the scope of the following claims.

What is claimed is:

1. A photovoltaic device comprising:
   a first heterojunction layer, the first heterojunction layer comprising a mixture of a first donor type organic material and a first acceptor type organic material; and
   an interlayer forming an interface with the first heterojunction layer,
   wherein each of the first donor type organic material and the first acceptor type organic material is associated with a corresponding predefined concentration profile, a concentration of the first donor type organic material increasing continuously throughout the first heterojunction layer from a first side of the first heterojunction layer to a second side of the first heterojunction layer, and a concentration of the first acceptor type organic material decreasing continuously throughout the first heterojunction layer from the first side of the first heterojunction layer to the second side of the first heterojunction layer, and
   wherein the concentration of the first donor type organic material is non-zero at the first side of the first heterojunction layer and the interlayer forms the interface with the first side of the first heterojunction layer, or the concentration of the first acceptor type organic material is non-zero at the second side of the first heterojunction layer and the interlayer forms the interface with the second side of the first heterojunction layer, and
   wherein the interlayer has a material composition that is different from the first heterojunction layer and different from a pure first acceptor type organic material or a pure first donor type organic material.

2. The photovoltaic device of claim 1 wherein the concentrations of the first donor type organic material and the first acceptor type organic material are non-zero at both the first side and the second side of the first heterojunction layer.

3. The photovoltaic device of claim 1 wherein the predefined concentration profile of the first donor type organic material, the first acceptor type organic material, or both the first donor type organic material and the first acceptor type organic material comprises a linear graded profile.

4. The photovoltaic device of claim 1 further comprising:
   an anode layer; and
   a cathode layer, wherein the first heterojunction layer is between the anode layer and the cathode layer.

5. The photovoltaic device of claim 4 further comprising a charge blocking layer between the anode layer and the first heterojunction layer.

6. The photovoltaic device of claim 5 wherein the charge blocking layer is molybdenum oxide.

7. The photovoltaic device of claim 1 wherein the first heterojunction layer further comprises a second donor type organic material.

8. The photovoltaic device of claim 7 wherein a concentration of the second donor type organic material is graded continuously from the first side of the first heterojunction layer to the second side of the first heterojunction layer.

9. The photovoltaic device of claim 1 further comprising a second acceptor type organic material.

10. The photovoltaic device of claim 9 wherein a concentration of the second acceptor type organic material is graded continuously from the first side of the first heterojunction layer to the second side of the first heterojunction layer.

11. The photovoltaic device of claim 1 further comprising a second heterojunction layer adjacent to the first heterojunction layer, the second heterojunction layer comprising a mixture of a second donor type organic material and a second acceptor type organic material,
wherein each of the second donor type organic material and the second acceptor type organic material is arranged according to a corresponding predefined concentration profile, a concentration of the second donor type organic material increasing continuously from the first side of the second heterojunction layer to the second side of the second heterojunction layer, and a concentration of the second acceptor type organic material decreasing continuously from the first side of the second heterojunction layer to the second side of the second heterojunction layer.

12. The photovoltaic device of claim 11 further comprising a charge coupling layer between the first heterojunction layer and the second heterojunction layer.

13. The photovoltaic device of claim 11 wherein the first heterojunction layer and the second heterojunction layer are arranged in a stack and are electrically coupled in series.

14. The photovoltaic device of claim 11 wherein the first heterojunction layer and the second heterojunction layer are arranged side by side and are electrically coupled in parallel.

15. The photovoltaic device of claim 1 wherein the predefined concentration profile of the first donor type organic material, the first acceptor type organic material, or both the first donor type organic material and the first acceptor type organic material comprises a nonlinear graded concentration profile.

16. The photovoltaic device of claim 1 wherein the predefined concentration profile of the first donor type organic material, the first acceptor type organic material, or both the first donor type organic material and the first acceptor type organic material comprises an exponential graded concentration profile.

17. The photovoltaic device of claim 1, wherein the interlayer comprises a material selected from the group consisting of molybdenum oxide (MoO$_3$), bathocuproine (BCP), poly (3,4-ethylenedioxythiophene):poly(styrenesulfonate) (PEDOT:PSS), copper phthalocyanine, 2-TNATA (4,4',4"-tris(2-naphthylphenylamino)triphenylamine), polyaniline, N,N'-diphenyl-N,N'-bis(3-methylphenyl)-(1,1'-biphenyl)-4,4'-diamine (poly-TPD), spiro-TPD, 4-4'-N,N'-dicarbazolyl-biphenyl (CBP), 4,4-bis[N-(1-naphthyl)-N-phenylamino] biphenyl (NPD), polypyrrole, poly(phenylene vinylene), an aromatic tertiary amine, a polynuclear aromatic tertiary amine, a 4,4'-bis(p-carbazolyl)-1,1'-biphenyl compound, and N,N,N',N'-tetraarylbenzidine.

18. The photovoltaic device of claim 1, wherein the interlayer is doped.

19. The photovoltaic device of claim 18, wherein the dopant is selected from the group consisting of Na, Li, and Cs.

20. A method of fabricating a photovoltaic device comprising:
depositing a mixture of a first donor type organic material and a first acceptor type organic material on a substrate to provide a first heterojunction layer depositing an interlayer wherein the interlayer forms an interface with the first heterojunction layer,
wherein each of the first donor type organic material and the first acceptor type organic material is associated with a corresponding predefined concentration profile, wherein a concentration of the first donor type organic material increasing continuously throughout the first heterojunction layer from a first side of the first heterojunction layer to a second side of the first heterojunction layer, and a concentration of the first acceptor type organic material decreasing continuously throughout the first heterojunction layer from the first side of the first heterojunction layer to the second side of the first heterojunction layer, and wherein the concentration of the first donor type organic material is non-zero at the first side of the first heterojunction layer and the interlayer forms the interface with the first side of the first heterojunction layer, or the concentration of the first acceptor type organic material is non-zero at the second side of the first heterojunction layer and the interlayer forms the interface with the second side of the first heterojunction layer, and wherein the interlayer has a material composition that is different from the first heterojunction layer and different from a pure first acceptor type organic material or a pure first donor type organic material.

21. The method of claim 20 further comprising depositing a second donor type organic material and a second acceptor type organic material on the first heterojunction layer to provide a second heterojunction layer.

22. The method of claim 20 further comprising annealing the photovoltaic device.

* * * * *